(12) United States Patent
Peng et al.

(10) Patent No.: US 8,188,648 B2
(45) Date of Patent: May 29, 2012

(54) SYSTEM FOR DISPLAYING IMAGES AND METHOD FOR FABRICATING THE SAME

(75) Inventors: Du-Zen Peng, Jhubei (TW);
Shih-Chang Chang, Jhudong Township (TW); Chang-Ho Tseng, Sinwu Township (TW)

(73) Assignee: Chimei Innolux Corporation, Chu-Nan (TW)

( * ) Notice: Subject to any disclaimer, the term of this patent is extended or adjusted under 35 U.S.C. 154(b) by 3 days.

(21) Appl. No.: 12/952,530

(22) Filed: Nov. 23, 2010

(65) Prior Publication Data

US 2011/0070797 A1    Mar. 24, 2011

Related U.S. Application Data

(62) Division of application No. 11/502,243, filed on Aug. 9, 2006, now Pat. No. 7,863,807.

(51) Int. Cl.
*H01J 63/04*  (2006.01)
*H01J 1/62*   (2006.01)
*H01J 9/24*   (2006.01)

(52) U.S. Cl. ........ 313/501; 313/503; 313/110; 313/483; 313/505; 313/506; 313/504; 445/24; 445/25

(58) Field of Classification Search ........................ None
See application file for complete search history.

(56) References Cited

U.S. PATENT DOCUMENTS

| 6,207,268 B1 | 3/2001 | Kosaka et al. |
| 6,306,559 B1 | 10/2001 | Tanamura et al. |
| 6,344,661 B1 | 2/2002 | Nagase et al. |
| 2002/0074936 A1 | 6/2002 | Yamazaki et al. |
| 2005/0116619 A1 | 6/2005 | Kuma et al. |
| 2005/0179371 A1 | 8/2005 | Broer et al. |

FOREIGN PATENT DOCUMENTS

CN    1661764    8/2005

*Primary Examiner* — Natalie Walford
(74) *Attorney, Agent, or Firm* — Liu & Liu

(57) ABSTRACT

Systems for displaying images and fabrication method thereof are provided. A representative system incorporates an electroluminescent device including light emitting units emitting lights with different luminescent intensities along light emitting paths thereof, formed overlying a substrate. And a compensation layer is disposed along the light emitting paths to adjust the different luminescent intensities for outputting substantially uniform light.

7 Claims, 6 Drawing Sheets

SYSTEM FOR DISPLAYING IMAGES AND METHOD FOR FABRICATING THE SAME

This is a Divisional of U.S. patent application Ser. No. 11/502,243, filed Aug. 9, 2006, which is commonly assigned to the assignee of the present invention, and which is incorporated by reference herein as if fully set forth herein.

BACKGROUND OF THE INVENTION

1. Field of the Invention

The invention relates to a system for displaying images and a method of fabricating the same.

2. Description of the Related Art

Currently, display devices, such as liquid crystal devices and EL devices, are increasingly used as displays of electronic devices, such as cellular phones and portable computers. An increasing number of these display devices are full-color displays.

A significant factor in display manufacturing is the performance of the display, or the uniformity of light emitted from the luminescent element. The luminescent element, however, may not generate equivalent light. Thus, an electroluminescent device with uniform light performance and the method for fabricating the same is desirable.

SUMMARY OF THE INVENTION

The invention provides an electroluminescent device capable of generating uniform light performance and a method for fabricating the same.

Systems for displaying images are provided. An exemplary embodiment of such as system comprises an electroluminescent device. The electroluminescent device comprises light emitting units emitting lights with different luminescent intensities along light emitting paths thereof, formed overlying a substrate; and a compensation layer disposed along the light emitting paths to adjust the different luminescent intensities thereof for outputting substantially uniform light.

A method for manufacturing a system for displaying images is provided. The system comprises an electroluminescent device. A substrate is provided. Light emitting units emitting lights with different luminescent intensities along light emitting paths thereof are formed overlying the substrate. A photosensitive layer is disposed along the light emitting paths. Lights from the light emitting units are irradiated to the photosensitive layer, such that the photosensitive layer changes to form an irradiated photosensitive layer with different transmittances in different regions corresponding to the lights received with different luminescent intensities for outputting substantially uniform light.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
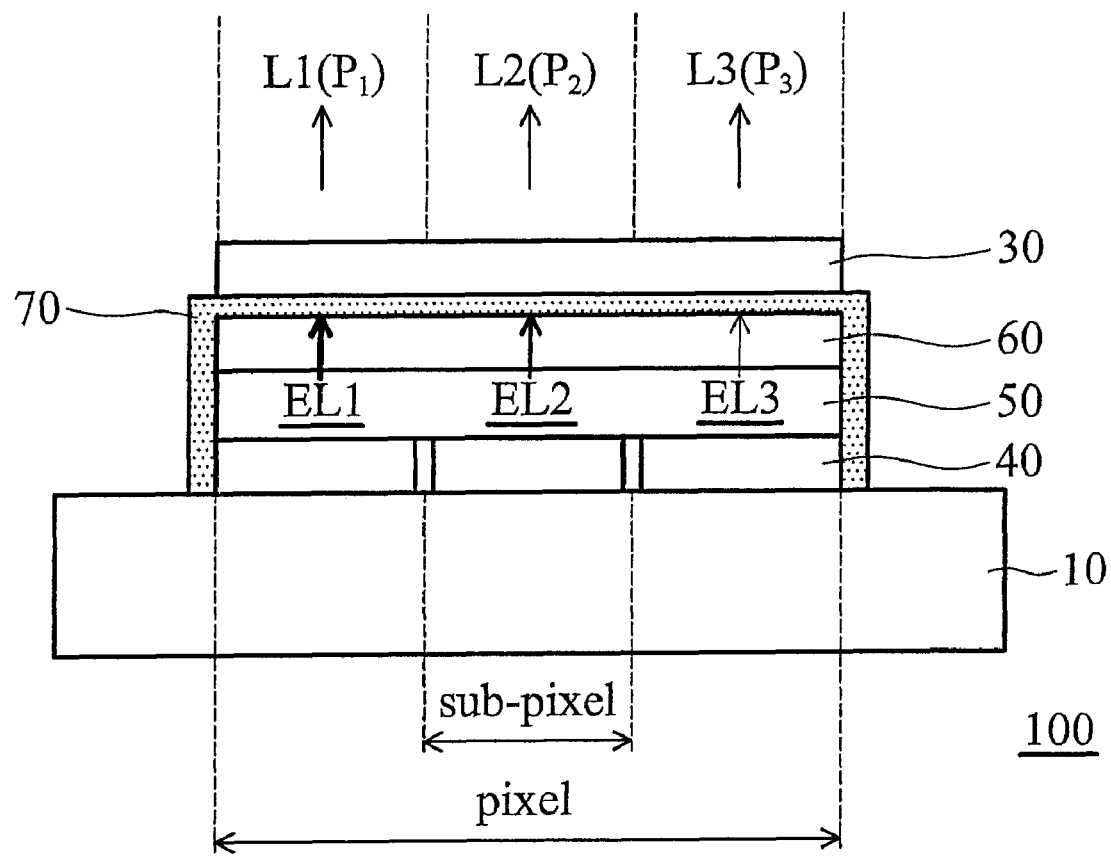
FIGS. 1A to 1B are cross sections illustrating manufacture of an embodiment of an electroluminescent device.
Figure 1B:
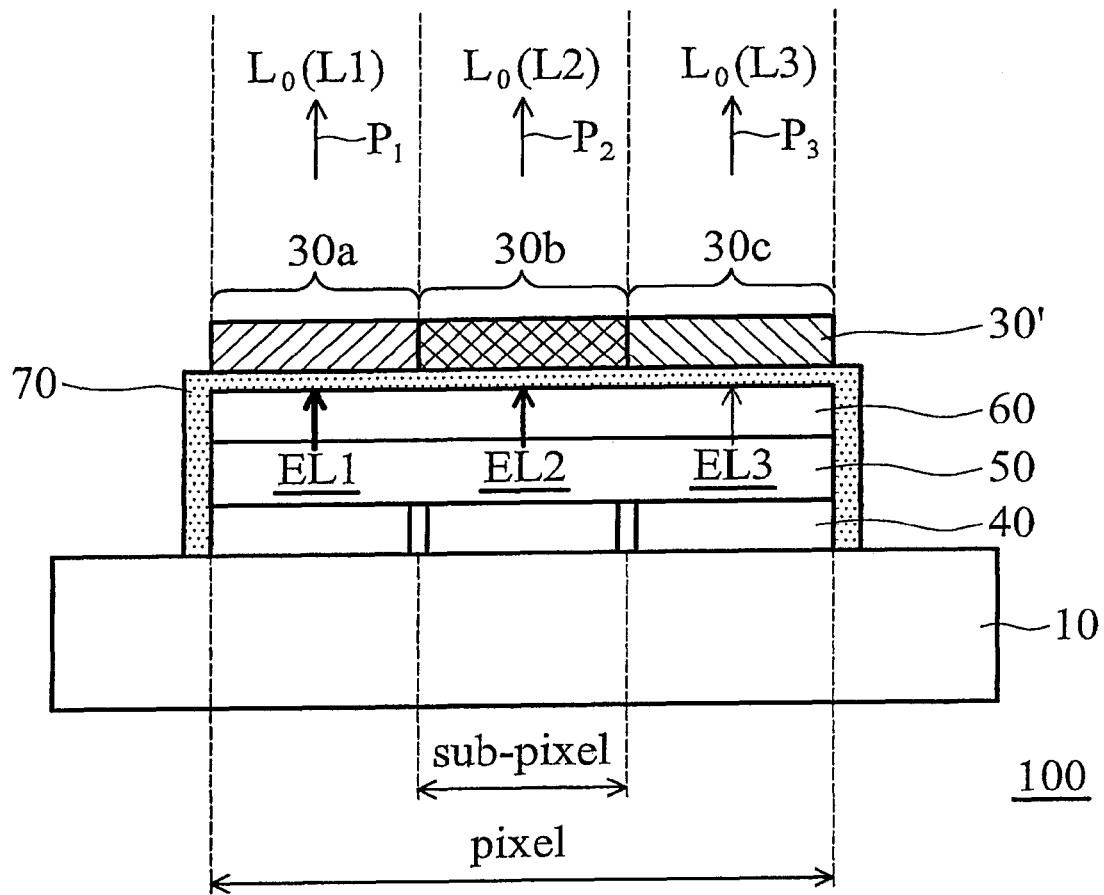

Exemplary embodiments of a system for displaying imagines and fabrication methods for the same will now be described. FIG. 1B shows a cross section view of an embodiment of a system for displaying images, which includes an electroluminescent device 100. FIG. 1A to 1B illustrate a method for manufacturing a system for displaying images.

Referring to FIG. 1A, a substrate 10 is provided. Light emitting units EL1~EL3 emitting lights L1~L3 with different luminescent intensities are situated on the substrate 10. In general, the lights L1~L3 with different luminescent intensities are emitted along light emitting paths $P_1$~$P_3$. Each light emitting unit EL1~EL3 can include a light emitting layer 50 sandwiched between a first electrode layer 40, such as an anode, and a second electrode layer 60, such as a cathode. Optionally, a dielectric layer 70 may be formed on the second electrode layer 60. Specifically, the dielectric layer 70 is made of an organic resin material and is formed to cover the edge of the anode 40 for preventing short circuits between the anode 40 and the subsequently-formed cathode 60. The dielectric layer 70 is formed of one selected from the group consisting of silicon nitride, silicon oxynitride, and silicon oxide.

Subsequently, a compensation layer is disposed along the light emitting paths L1~L3 to adjust the different luminescent intensities thereof for outputting substantially uniform light L0. In this case, the compensation layer can be disposed overlying the light emitting units EL1~EL3 or underlying the substrate 10.

As shown in FIG. 1A, for example, a photosensitive layer 30 with an original transmittance is first disposed along the light emitting paths L1~L3, such as overlying the light emitting units EL1~EL3. In FIG. 1B, the photosensitive layer 30 is then irradiated by the lights L1~L3 from the light emitting units EL1~EL3 to form an irradiated photosensitive layer 30' serving as the compensation layer which changes to have different transmittances in different regions 30a~30c corresponding to the lights received with different luminescent intensities.

In one example, light L1 from the light emitting unit EL1, with higher luminescent intensity, irradiates to the photosensitive layer 30 along the path $P_1$. Light L2 from the light emitting unit EL2, with lower luminescent intensity, irradiates to the photosensitive layer 30 along the path $P_2$. Thus, the irradiated photosensitive layer 30' changes or generally decreases to have different transmittances in the regions 30a and 30b corresponding to the light emitting units EL1 and EL2. In this case, the irradiated photosensitive layer in the first region 30a changes to have a lower transmittance, since it is irradiated with light L1 of higher luminescent intensity. The irradiated photosensitive layer in the second region 30b does not change its transmittance or change to have a higher transmittance than that of the first region, since it is irradiated with light L2 of lower luminescent intensity. Alternatively, the irradiated photosensitive layer in the first region 30a does not change its transmittance, and the irradiated photosensitive layer in the second region 30b changes to have a higher transmittance. Thus, light output of the light emitting units EL1 and EL2 can be compensated, since light L1 with higher luminescent intensity passes through the region 30a with lower transmittance and light L2 with lower luminescent intensity passes through the region 30b with higher transmittance.

Then, the irradiated photosensitive layer 30' is fixed to have a fixed property with different transmittances in different regions. For example, the irradiated photosensitive layer 30' can be performed by developing to fix the transmittance property.

Thus, as described above, by means of the irradiated photosensitive layer 30' with different transmittances serving as a compensation layer, non-uniform luminescent intensities of lights L1~L3 emitted from the light emitting units EL1~EL3 are adjusted to produce uniform or substantially uniform light output $L_0$. "Substantially uniform" means that the light preferably varies about ±10% in luminescent intensity, more preferably about ±5% in luminescent intensity, and most preferably about ±2% in luminescent intensity over the whole panel.

In some embodiments, the photosensitive layer 30 may be any material that can change transmittance after irradiation by light, specifically, any material that can change, such as decrease to different transmittance after irradiation by light with different luminescent intensities. Representative examples of the photosensitive layer 30 include a negative film, a conjugated polymer, and a silver-containing compound such as a silver halide.

Further, in one example, the light emitting units EL1~EL3 comprise an organic electroluminescent element, which includes organic or organometallic material that produces light. Hereinafter, the term organic will be taken to include both purely organic and organometallic materials. The light emitting layer 50 can be a single pure material with a high luminescent efficiency. For example, a well-known material for this purpose is tris(8-quinolinolato-N1,08)aluminum (Alq), which produces excellent green electroluminescence.

In this case, the substrate 10 provides mechanical support for the light emitting units EL1~EL3 and for electrical leads connecting the light emitting units to a current source. The cathode 60, or both the anode 40 and the substrate 10, can be transparent to the electroluminescent light, allowing that light to be viewed. The term transparent refers to the ability to transmit no less than 80 percent of the electroluminescent light. In a variant of this structure, the cathode, rather than the anode, rests upon the substrate. In that variant, either the anode, or both the cathode and the support substrate, are transparent to the electroluminescent light. When the cathode and anode are connected to a current source (not shown), recombining in the light emitting unit to produce electroluminescent light.

Referring to FIG. 1B again, electroluminescent device 100 may be an active matrix OLED display device (AMOLED) comprising a plurality of pixels according to an exemplary embodiment of the invention. To achieve substantially uniform light output, each light emitting unit EL1~EL3 preferably serves as a sub-pixel in a pixel cell.

Moreover, the principles of the invention can be applied to either a top emission type organic electroluminescent display device or a bottom emission type organic electroluminescent display device.

Figure 2:
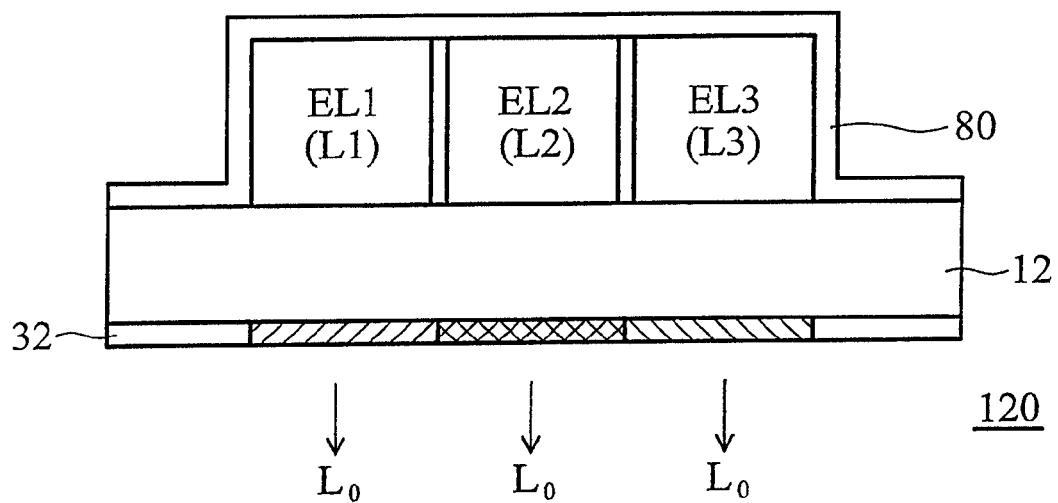
FIG. 2 is a schematic cross-sectional view of an embodiment of a bottom emission type organic electroluminescent display device.

For example, in FIG. 2, a schematic cross-sectional view of an exemplary bottom emission type organic electroluminescent display device 120 is illustrated. Organic light emitting diodes EL1~EL3 similar to the structure as shown in FIG. 1B are disposed overlying a transparent substrate 12 and a covering layer 80 is formed thereon. In this case, a lower electrode serving as an anode 40 is formed of the transparent conductive material, while an upper electrode serving as a cathode 60 is formed of the opaque conductive material. Thus, the lights emitted from the organic light emitting diodes EL1~EL3 are released in a bottom direction.

An important feature is forming, preferably attaching irradiated photosensitive layer 32 with different transmittances in different regions underlying the substrate 12 to adjust the non-uniform luminescent intensities of lights L1~L3 emitted from the light emitting units EL1~EL3 to produce substantially uniform light output $L_0$.

Figure 3:
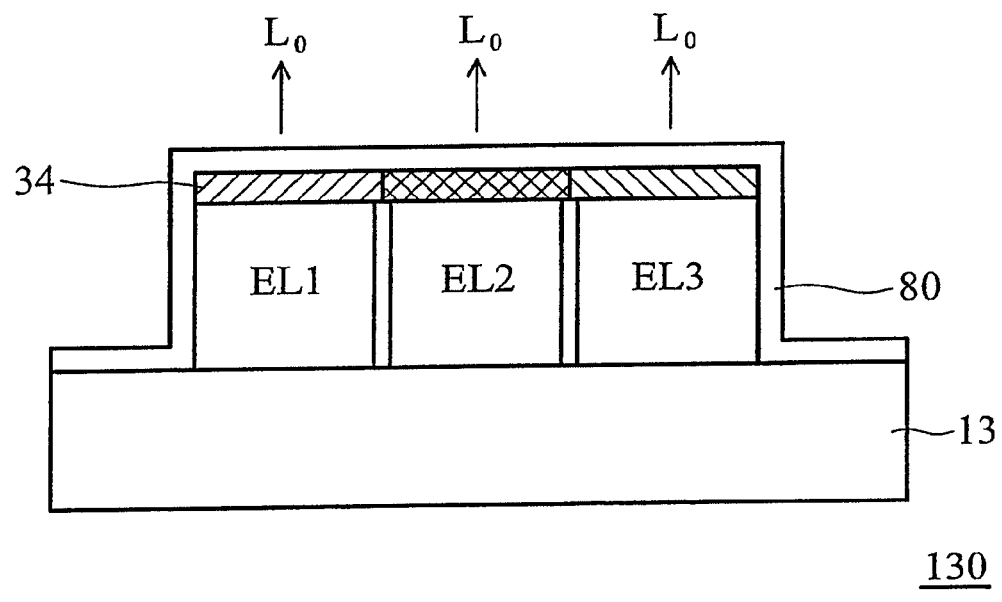
FIGS. 3 and 4 are schematic cross-sectional view of embodiments of a top emission type organic electroluminescent display device.

FIG. 3 illustrates a schematic cross-sectional view of an exemplary top emission type organic electroluminescent display device 130. Organic light emitting diodes EL1~EL3 are disposed overlying a substrate 13. In this case, a lower electrode serving as an anode 40 is formed of the opaque conductive material, while an upper electrode serving as a cathode 60 is formed of transparent conductive material. Thus, the lights emitted from the organic electroluminescent diodes EL1~EL3 are released in an upward direction.

A feature is forming, preferably depositing irradiated photosensitive layer 34 with different transmittances on the organic light emitting diodes EL1~EL3 to adjust the non-uniform luminescent intensities of lights L1~L3 emitted from the light emitting units EL1~EL3 to produce substantially uniform light output $L_0$. In this case, covering layer 80 is formed to cover the irradiated photosensitive layer 34 and the organic light emitting diodes EL1~EL3.

Figure 4:
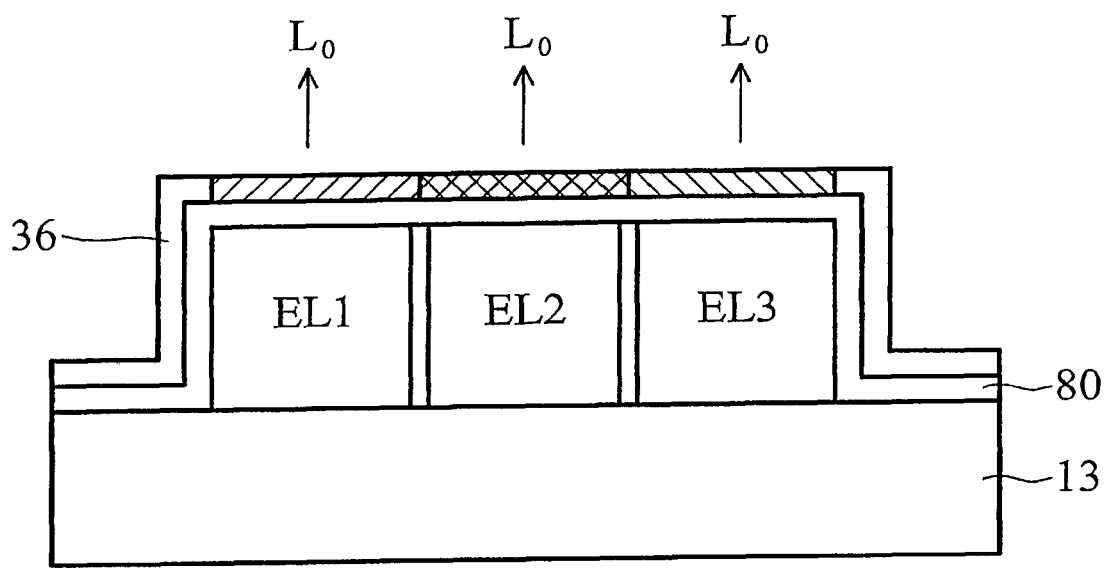

As a modification, in FIG. 4, a schematic cross-sectional view of a top emission type organic electroluminescent display device 140 is shown. Covering layer 80 may be first formed to cover the organic light emitting diodes EL1~EL3, and an irradiated photosensitive layer 36 with different transmittances is then formed on the covering layer 80.

Thus, the irradiated photosensitive layer may be disposed in various locations. In some embodiments, the irradiated photosensitive layer is disposed between the light emitting units EL1~EL3 and the covering layer 80. In some embodiments, the irradiated photosensitive layer is disposed under the substrate or over the covering layer.

As described above, in some embodiments, the transparent conductive material may be a conductive and transparent metal oxide. For example, indium tin oxide (ITO) has been widely used as the transparent electrode because of its transparency, good conductivity, and high work function. Furthermore, the opaque conductive material may be a metal having a low work function, such as aluminum or silver.

Another important feature is described with reference to FIG. 2~FIG. 4. In these embodiments, the irradiated protective layer 32, 34 and 36 may be removed from the attached surface and then be putted into a developer tank to develop for fixing the transmittance property thereof. After that, the irradiated protective layer 32, 34 and 36 with fixed transmittance property can be reattached again. Moreover, it is possible to put the entire organic electroluminescent display device with the irradiated protective layer 32 or 36 directly into the developer tank to develop, while the irradiated protective layer 32 or 36 is secured to the outside surface of the covering layer 80 or the substrate 12 as shown in FIG. 2 and FIG. 4.

Thus, the use of the irradiated photosensitive layer with different transmittances may permit the light output of an electroluminescent device to be substantially uniform.

An alternative embodiment of the invention will be described with reference to FIG. 5, which is a cross section of an embodiment of a system for displaying images, which includes an electroluminescent device 300. According to this embodiment, the irradiated photosensitive layer 30' with different transmittances of FIG. 1B is removed. Instead, the differences between the original emitting lights L1~L3 from light emitting units EL1~EL3 and the uniform output light L0 are transformed into corresponding digital compensation values which can be stored in a compensation unit 370. For example, the differences in light intensity between the emitting lights L1~L3 and the substantially uniform light L0 can be calculated and then be transformed into the corresponding digital compensation values.

Figure 5:
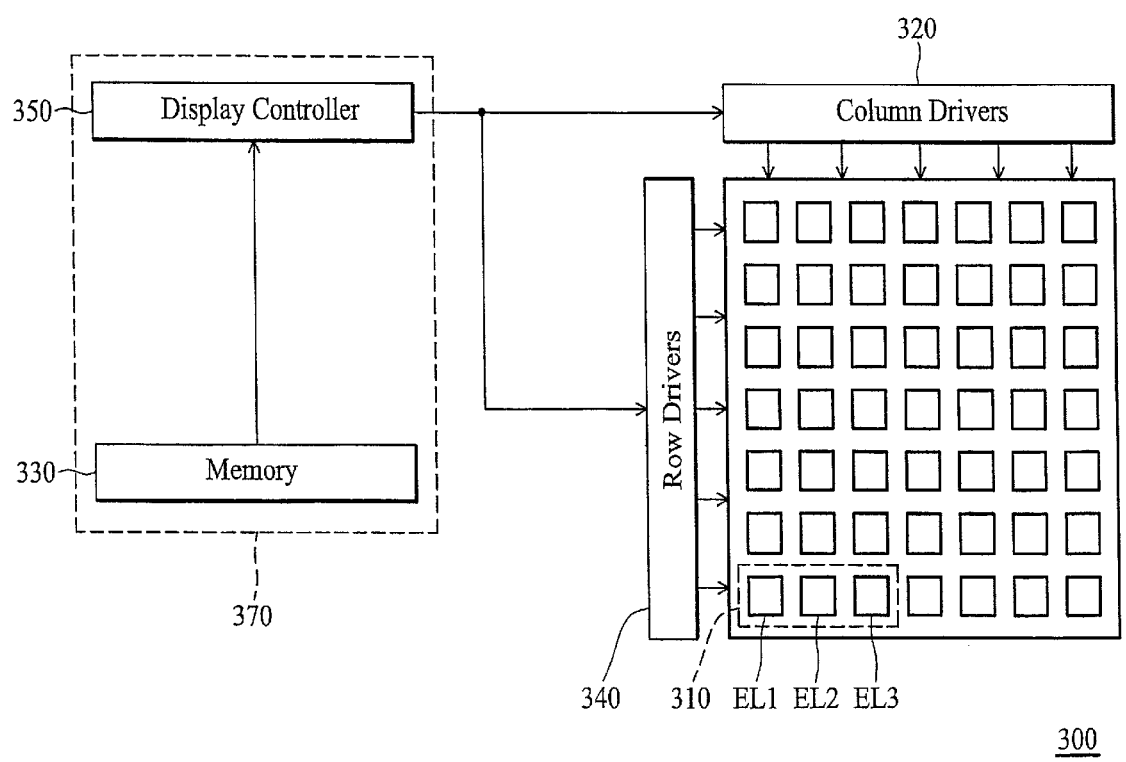
FIG. 5 is a block diagram of an embodiment of an electroluminescent device with pixel cells.

Referring to FIG. 5, the electroluminescent device 300 comprises a plurality of pixel cells 310 arranged in an array. In this case, each pixel cell 310 comprises sub-pixels EL1~EL3. However, the pixel or subpixel is generally used to designate the smallest addressable unit in a display panel. For a monochrome display, there is no distinction between pixel and subpixel. The term "subpixel" is used in multicolor display panels and is employed to designate any portion of a pixel, which can be independently addressable to emit a specific color. In a full-color display, a pixel generally comprises three primary-color subpixels, namely blue, green, and red.

In one example, the compensation unit 370 comprises a memory 330 storing the corresponding digital compensation values and a display controller 350 coupled to the memory 330. The subpixels EL1~EL3 are addressed with column drivers 320 and row drivers 340, which are controlled by the display controller 350 of the compensation unit 370. Therefore, the display controller 350 controls the column drivers 320 to adjust the luminescent intensities operative to supply a plurality of signals to the subpixels EL1~EL3 to display images, based on the corresponding digital compensation values from the memory unit 330. The method of manufacturing the electroluminescent device 300 of FIG. 5 is similar to that of manufacturing the electroluminescent device 100 of FIGS. 1A~1B, except that the irradiated photosensitive layer 30' is removed and replaced by the compensation unit 370.

As described above, the compensation unit 370 may control the column drivers 320 to adjust the luminescent intensities of each subpixel as shown in FIG. 1B, by using the digital compensation values. Specifically, the digital compensation values stored in the memory unit 330 is adapted to decrease the light with higher luminescent intensity or increase the light with lower luminescent intensity. Therefore, the light output L0 of the electroluminescent device 300 can be adjusted to be uniform or substantially uniform.

Figure 6:
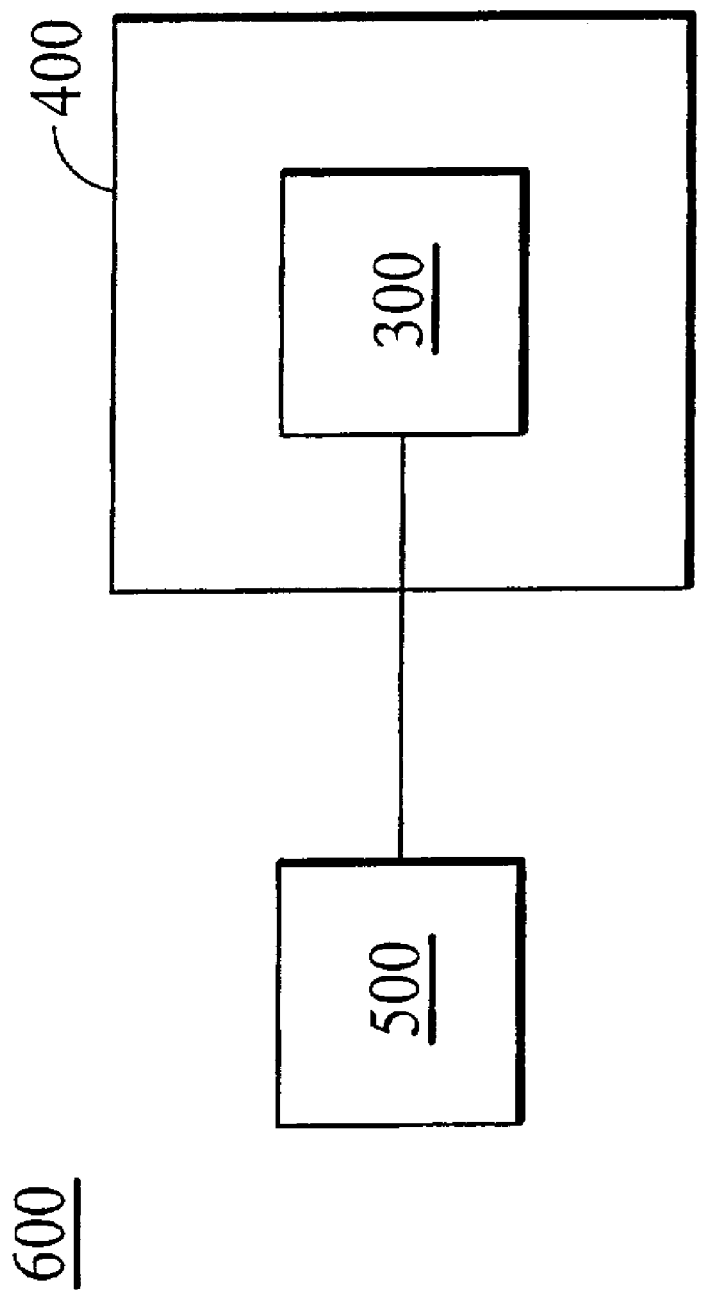
FIG. 6 schematically shows an embodiment of a system for displaying images.

FIG. 6 schematically shows another embodiment of a system for displaying images which, in this case, is implemented as a display panel 400 or an electronic device 600. The described electroluminescent device 100, 200, and 300 in FIGS. 1B to 5 can be incorporated into a display panel that can be an OLED panel. As shown in FIG. 6, the display panel 400 comprises an electroluminescent device 300 shown in FIG. 5, such as the active matrix organic electroluminescent device. The display panel 400 can form a portion of a variety of electronic devices (in this case, electronic device 600). Generally, the electronic device 600 can comprise the display panel 400 and an input unit 500. Further, the input unit 500 is operatively coupled to the display panel 400 and provides input signals (e.g., an image signal) to the display panel 400 to generate images. The electronic device 600 can be a mobile phone, digital camera, PDA (personal digital assistant), notebook computer, desktop computer, television, car display, or portable DVD player, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a system for displaying images, wherein the system comprising an electroluminescent device, the method comprising:
   providing a substrate;
   forming light emitting units emitting lights with different luminescent intensities along light emitting paths thereof overlying the substrate;
   disposing a photosensitive layer along the light emitting paths; and
   irradiating the lights from the light emitting units to the photosensitive layer, such that the photosensitive layer changes to form an irradiated photosensitive layer with different transmittances in different regions corresponding to the lights received with different luminescent intensities for outputting substantially uniform light.

2. The method as claimed in claim 1, wherein the irradiated photosensitive layer comprises a first region and a second region, the method further comprising:
   irradiating light with a higher luminescent intensity to the first region to form a lower transmittance; and
   irradiating light with a lower luminescent intensity to the second region to form a higher transmittance than the first region.

3. The method as claimed in claim 1, further comprising fixing the irradiated photosensitive layer to have a fixed property with different transmittances in different regions.

4. The method as claimed in claim 3, wherein the step of fixing is performed by developing.

5. The method as claimed in claim 1, further comprising:
   removing the irradiated photosensitive layer;
   fixing the irradiated photosensitive layer to have a fixed property with different transmittances in different regions; and
   reattaching the irradiated photosensitive layer.

6. The method as claimed in claim 4, further comprising:
   removing the irradiated photosensitive layer;
   transforming differences between the emitting lights from light emitting units and the substantially uniform light into corresponding digital compensation values;
   storing the corresponding digital compensation values; and
   adjusting the luminescent intensities operative to supply a plurality of signals to the light emitting units to display images, based on the corresponding digital compensation values.

7. The method as claimed in claim 6, wherein the transforming step comprises:
   calculating the differences in light intensity between the emitting lights from light emitting units and the substantially uniform light; and
   transforming the differences in light intensity therebetween into the corresponding digital compensation values.

* * * * *